(12) United States Patent
Bator et al.

(10) Patent No.: US 6,534,707 B1
(45) Date of Patent: Mar. 18, 2003

(54) METHOD FOR ABSORBING ACTIVE, EXTERNAL AND DYNAMIC MAGNETIC FIELDS USING A FERRITE ENCAPSULATED COATING

(75) Inventors: Philip M. Bator, Farmington, MI (US); Andrew R. Macko, Fenton, MI (US); Jack H. King, Jr., Howell, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/686,189

(22) Filed: Oct. 11, 2000

(51) Int. Cl.[7] ................................................. H05N 9/00
(52) U.S. Cl. ............................. 174/35 R; 174/35 MS; 257/789; 257/795
(58) Field of Search ...................... 174/35 MS, 35 R; 361/816, 818; 257/787, 788, 789, 795

(56) References Cited

U.S. PATENT DOCUMENTS

| 4,188,605 A | | 2/1980 | Stout |
| 4,474,676 A | | 10/1984 | Ishino et al. |
| 4,698,197 A | * | 10/1987 | Kerns et al. ............ 174/35 MS |
| 4,933,744 A | | 6/1990 | Segawa et al. |
| 5,371,404 A | | 12/1994 | Juskey et al. |
| 5,547,599 A | | 8/1996 | Wolfrey et al. |
| 5,677,511 A | | 10/1997 | Taylor et al. |
| 5,709,960 A | | 1/1998 | Mays et al. |
| 5,864,088 A | * | 1/1999 | Sato et al. ............ 174/35 MS |
| 6,190,509 B1 | * | 2/2001 | Haba ........................... 204/164 |
| 6,291,274 B1 | * | 9/2001 | Oida et al. .................. 438/123 |

* cited by examiner

Primary Examiner—Anthony Dinkins
Assistant Examiner—Carmelo Oliva
(74) Attorney, Agent, or Firm—John Kajander, Esq.

(57) ABSTRACT

A method to absorb magnetic fields begins by placing an electronic unit into a fixture. The electronic unit contains at least one electrical component, such as a microchip, that requires a reduction of a magnetic field. The microchip can be surrounded by a containment apparatus, such as a mold, into which encapsulant is poured. Exclusion devices, such as masks, protect components that should not be coated. Once the electronic unit is prepared, it is exposed to magnetic field interference. At this point, encapsulant is poured into all molds on the electronic unit. Ferrite particles comprise a portion of the encapsulant and initially are randomly distributed throughout. When the ferrite particles are exposed to a magnetic field, they migrate along the generated field lines and absorb the magnetic field. After the new distribution of ferrite particles occurs, the encapsulant can be cured. Curing the encapsulant causes the ferrite particles to be frozen in place along the field lines, allowing for continuous protection of the microchip.

12 Claims, 4 Drawing Sheets

METHOD FOR ABSORBING ACTIVE, EXTERNAL AND DYNAMIC MAGNETIC FIELDS USING A FERRITE ENCAPSULATED COATING

TECHNICAL FIELD

The present invention relates generally to magnetic field absorption, and more particularly, to a ferrite encapsulate coating used for magnetic field absorption.

BACKGROUND ART

Metal-based housings are traditionally utilized to protect electronic circuitry from magnetic field interference. Although these devices effectively accomplish the task, the additional cost and added bulk of metal-based housings frequently prevent their incorporation into a final product. Many different products and methods have evolved which improve on both the cost and bulk issues of metal-based housings, but these products and methods also have their own limitations.

One such device is discussed in U.S. Pat. No. 4,474,676, which discloses a shielding material partially consisting of ferrite flakes. The shielding material typically is disbursed into the plastic housing of a device that emits electromagnetic interference (EMI), such as a computer CPU. The shielding material in the plastic housing reduces the amount of EMI radiated into external surroundings. While the material disclosed in '676 may be effective at reducing EMI emissions, it does not absorb magnetic radiation. Instead it reduces the amount of EMI radiated into the environment.

A second mechanism to reduce electromagnetic interference without cost and space limitations is addressed in U.S. Pat. No. 5,547,599, which discloses an epoxy film. The epoxy film is comprised mainly of a random distribution of ferrite particles in powder form. In its characteristic usage, the epoxy film covers word straps, which are conductive fixtures, on plated wire memory devices and protects them from EMI radiation emitted by external sources. Once the epoxy film covers the word straps, it must be heat cured. Because the epoxy film requires heat curing, it is ill suited for application on heat sensitive components. An additional limitation concerns the random distribution of the ferrite particles after the film is cured. Because the ferrite particles are not concentrated in the locations on the word straps that are most affected by EMI radiation, the epoxy film's ability to absorb the magnetic radiation is reduced.

U.S. Pat. No. 6,063,511 discloses a typically ferrite-based film to absorb EMI radiation. The film of '511 is sprayed onto a surface susceptible to EMI radiation. The thickness of most ferrite flakes in this film must be less than the skin depth of all frequencies of EMI radiation that need to be protected against. One limitation of this film is that only the predetermined frequencies of EMI radiation are protected against; thus, any component covered with this film is vulnerable to EMI radiation of an unanticipated frequency. Further, as with '599, because the ferrite flakes' location is fixed, they are not able to travel to the location on the component that is most affected by EMI radiation.

Because of the disadvantages of the prior art, it is apparent that a new method for absorbing magnetic field interference is needed. This new method should adequately absorb magnetic field interference on the component needing protection. The new method should also give the absorbing material the ability to migrate to the location on the component most affected by magnetic field interference. Finally, the new method should allow for several means of curing the medium containing the ferrite particles. The present invention is directed to meeting these ends.

SUMMARY OF THE INVENTION

One object of the invention is to provide an improved and reliable means to absorb a magnetic field. Another object of the invention is to decrease the costs associated with providing a means to absorb a magnetic field. A third object of the invention is to use ferrite particle migration in order to achieve a more efficient magnetic field absorbing device.

In one aspect of the invention, a method to absorb magnetic field interference begins by placing an electronic unit, such as a seat control module, into a fixture. The electronic unit contains at least one electrical component, such as a microchip, requiring the reduction of a magnetic field. The microchip can be surrounded by a containment apparatus, such as a mold, into which encapsulant is poured. In addition, exclusion devices, such as masks, protect components that should not be coated with encapsulant. Once the electronic unit is prepared, it is exposed to at least one source of magnetic field interference. At this point, encapsulant is poured into all molds on the electronic unit. Ferrite particles comprise a portion of the encapsulant and are randomly distributed throughout. When the ferrite particles are exposed to magnetic field interference, they migrate along the generated field lines and absorb the magnetic field interference. After the new distribution of ferrite particles occurs, the encapsulant can be cured. Curing the encapsulant causes the ferrite particles to be frozen in place along the field lines, allowing for continuous protection of the microchip.

The present invention thus achieves an improved method to absorb a magnetic field. The present invention is advantageous because it is less expensive and occupies considerably less space than metal-based magnetic field absorbing devices. The present invention also minimizes heat buildup on the encapsulate-coated components.

Additional advantages and features of the present invention will become apparent from the description that follows and may be realized by means of the instrumentalities and combinations particularly pointed out in the appended claims, taken in conjunction with the accompanying drawings.

BRIEF DESCRIPTION OF THE DRAWINGS

In order that the invention may be well understood, there will now be described some embodiments thereof, given by way of example, reference being made to the accompanying drawings, in which.

BEST MODE(S) FOR CARRYING OUT THE INVENTION

In the following figures, the same reference numbers identify identical components in the various views. The present invention illustrates a method for absorbing active, external and dynamic magnetic fields using a ferrite encapsulate coating particularly suited for covering electronic units. However, the present invention also applies to various other uses that may require a method for absorbing active, external and dynamic magnetic fields using a ferrite encapsulate coating.

Figure 1:
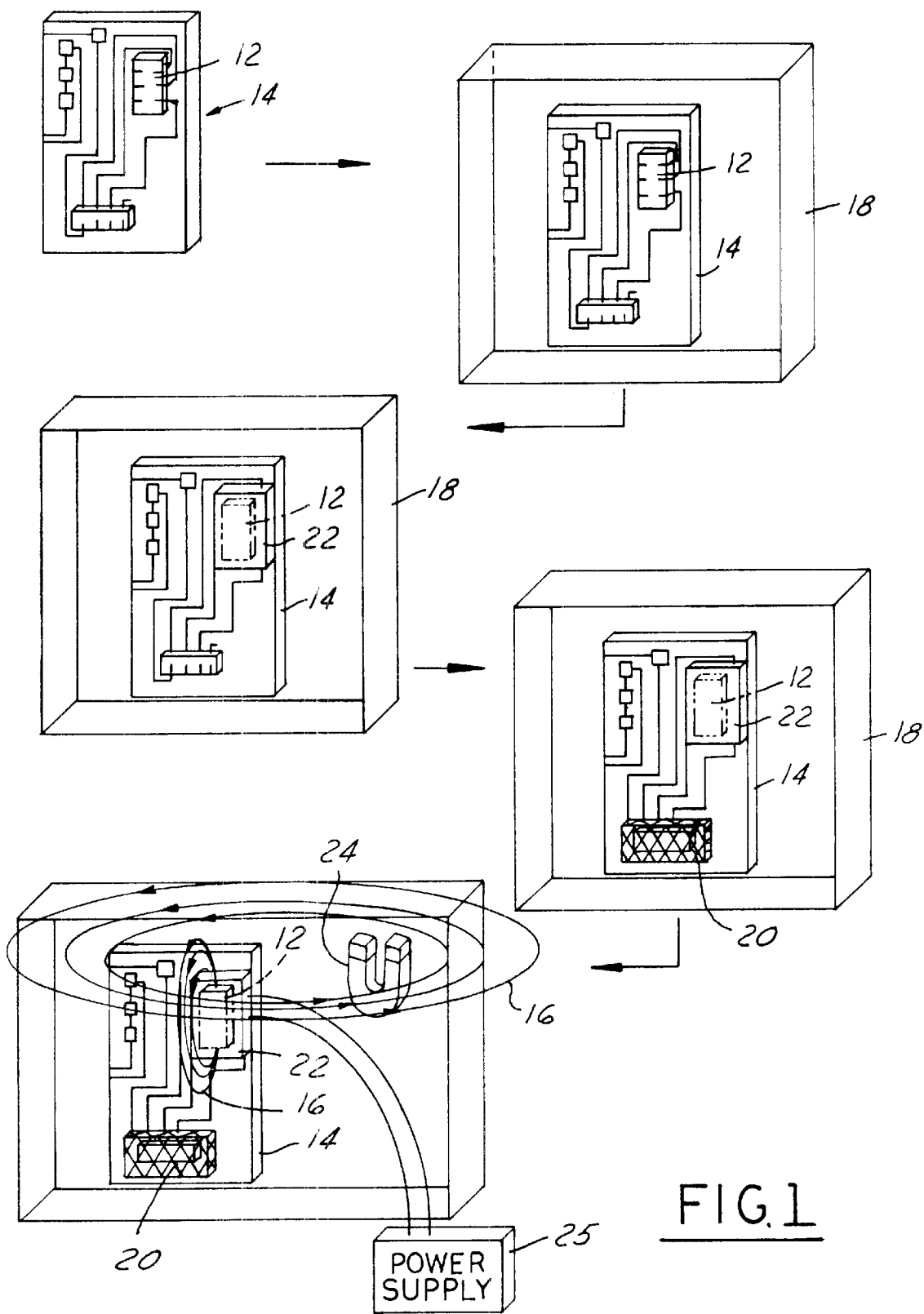
FIG. 1 is a flow diagram illustrating the steps taken to prepare the electronic unit to receive encapsulant and to expose the electronic unit to magnetic radiation in accordance with one embodiment of the present invention.

Referring to FIG. 1, a flow diagram illustrating the initial steps of the process 10 to protect an electrical component, such as a microchip 12, on an electronic unit 14 from magnetic field interference 16 in accordance with one embodiment of the present invention is shown. One skilled in the art would realize that the process is merely one representation of many possible processes to use a ferrite encapsulate coating to protect components on an electronic unit 14. Further, this process can be used to protect other components by coating the radiating component with encapsulant. Although a variety of encapsulants may be utilized, one embodiment contemplates the use of a non-conductive encapsulant with low hygroscopic tendencies. The use of a base material having these properties to form the encapsulant would be one logical approach. Additionally, one skilled in the art would realize that microchips 12 are merely one type of electrical component that may need to be protected from magnetic field interference 16.

The electronic unit 14 is initially placed inside a fixture 18. A number of containment apparatuses, such as molds 20, can be placed around microchips 12 that need to be covered with encapsulant (not shown). The molds 20 serve to provide structure for the encapsulant while still in its liquid state, much like an ice cube tray provides structure for water. One skilled in the art would realize that molds 20 are merely one type of containment apparatus that can be used to provide structure for the encapsulant. Once the encapsulant hardens and no longer needs the structural support the molds 20 provide, the molds 20 are removed. In the event the entire electronic unit 14 must be covered with encapsulant, molds 20 are not used.

In a similar manner, exclusion apparatuses, such as masks 22, can also be added to the electronic unit 14. Masks 22 serve to prevent encapsulate from being poured onto components where it is not needed. One skilled in the art would realize that masks 22 are merely one type of exclusion apparatus that can be used to prevent encapsulant from being poured on a microchip 12. As in the case with molds 20, if the entire electronic unit 14 must be covered with encapsulant, masks 22 are not used.

Before encapsulant is poured, a source of magnetic field interference 16 is needed. The magnetic field interference 16 can be created actively by the microchip 12 itself. In this case, a power supply 25 generates the current and voltage necessary to activate the microchip 12. One skilled in the art will realize that a power supply 25 is merely one many possible ways to activate a microchip 12.

The magnetic field interference 16 can also be created passively by an external source. For example, if a first electronic unit were placed in close proximity to a second unit that produced magnetic field interference, the second unit would be a source of magnetic field interference to the first. In the process depicted in FIG. 1, placing at least one magnet 24 into the fixture 18 creates passive magnetic field interference 16. One skilled in the art would realize that magnets 24 are merely one way to simulate external magnetic field interference 16. The magnet's 24 position in the fixture should mimic the expected location of external magnetic field interference 16 the microchip 12 will experience once the electronic unit 14 is installed into a product. Similarly, the magnet's 24 strength should mimic the strength of the external magnetic field interference that the microchip 12 will experience.

Figure 2:
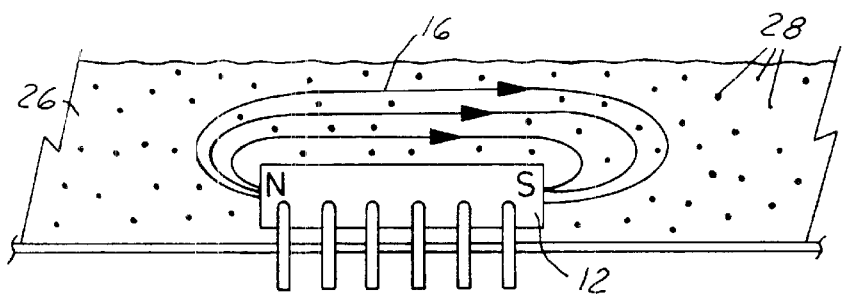
FIG. 2 illustrates a microchip actively producing a magnetic field, initially coated with encapsulant, before the ferrite particles migrate along magnetic field lines in accordance with one embodiment of the present invention.

Referring to FIG. 2, a microchip 12, initially coated with encapsulant 26, actively producing magnetic field interference 16 according to one embodiment of the present invention is illustrated. Because the ferrite particles 28 in the encapsulant 26 have not been allowed time to migrate, their distribution remains random throughout the encapsulant 26.

Figure 3:
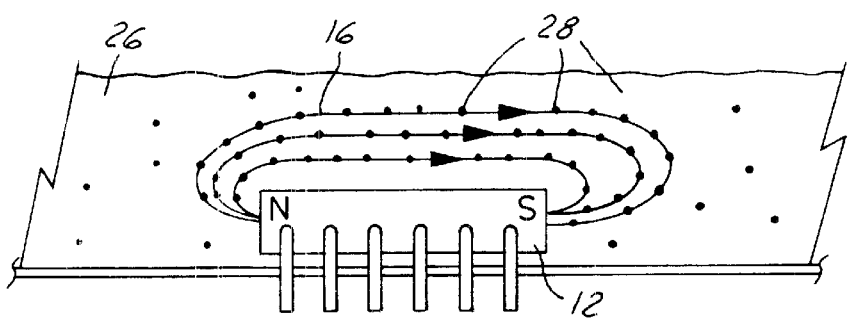
FIG. 3 depicts the relative location of the ferrite particles once migration has taken place with respect to the active magnetic field produced by the microchip in accordance with one embodiment of the present invention.

Referring to FIG. 3, the relative location of the ferrite particles 28 after time has been allotted for migration according to one embodiment of the present invention is depicted. The random distribution of ferrite particles 28 in FIG. 2 has given way to a new distribution ordered along the field lines of the active magnetic field interference 16. Once enough time passes for the ferrite particles 28 to migrate to their new location along the field lines, the encapsulant 28 is cured. One skilled in the art will realize that the method used to cure the encapsulant 28 depends upon a number of factors, including, but not limited to, the chemical composition of the ferrite, the microchip's 12 ability to tolerate heat, the speed at which the encapsulant 26 must be cured and whether the entire electronic unit (best seen in FIG. 1) is coated with encapsulant 26.

Figure 4:
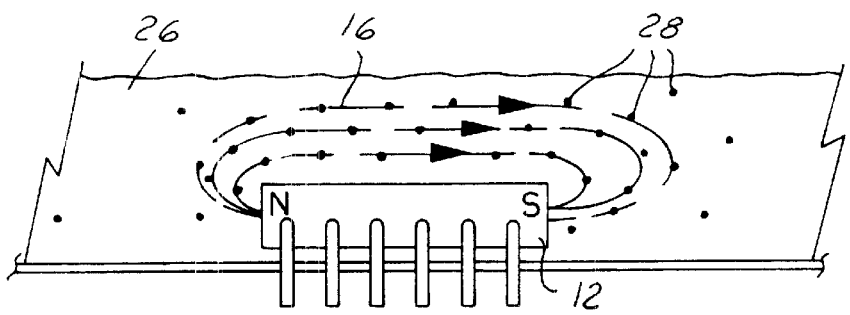
FIG. 4 illustrates the overall effect the ferrite particles have on absorbing the active magnetic field once the ferrite particles have migrated and fixed in place by curing in accordance with one embodiment of the present invention.

Referring to FIG. 4, the overall effect the ferrite particles 28 have on absorbing the active magnetic field interference 16 according to one embodiment of the present invention is illustrated. Once the encapsulant 26 is cured, the ferrite particles 28 are fixed in their location along the field lines created by the active magnetic field interference 16. In this fixed location, the ferrite particles 28 will absorb the energy generated by the active magnetic field interference 16, thus weakening overall field strength. Because of the reduction in field strength, the active magnetic field interference 16 will have a reduced effect on surrounding components that are sensitive to radiated emissions.

Figure 5:
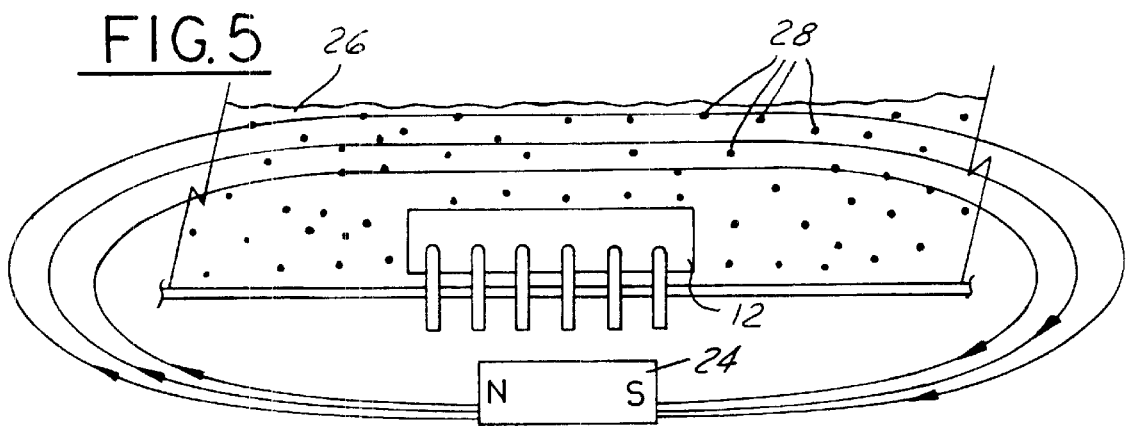
FIG. 5 illustrates a component external to the electronic unit passively producing a magnetic field and where the microchip is initially coated with encapsulant before the ferrite particles migrate long magnetic field lines in accordance with one embodiment of the present invention.

Referring to FIG. 5, a microchip 12, initially coated with encapsulant 26 and exposed to passive magnetic field interference 16 according to one embodiment of the present invention, is illustrated. Here, an external magnet 24 passively creates magnetic field interference 16. As in FIG. 2, the ferrite particles 28 are randomly distributed throughout the encapsulant 26 when the encapsulant is initially applied to the microchip 12.

Figure 6:
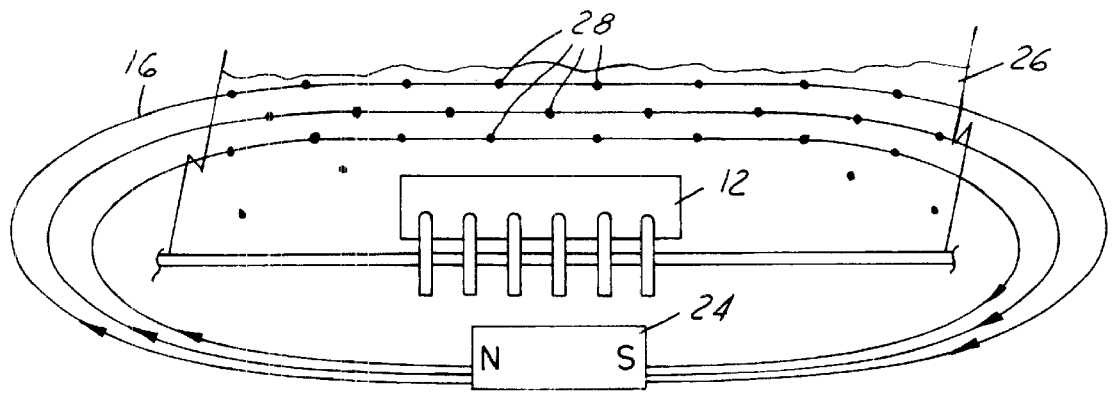
FIG. 6 depicts the relative location of the ferrite particles once migration has taken place with respect to the passive magnetic field produced by the external component in accordance with one embodiment of the present invention.

Referring to FIG. 6, the ferrite particle 28 distribution after migration, while exposed to passive magnetic field interference 16, according to one embodiment of the present invention is depicted. Here, as in FIG. 3, the ferrite particles 28, originally distributed randomly throughout the encapsulant 26, are now concentrated along the field lines generated by the external magnet 24. Once enough time passes to allow most of the ferrite particles 28 to migrate to their new location along the field lines of the magnetic field interference 16, the encapsulant 28 is cured. Again, one skilled in the art will realize that the method used to cure the encapsulant 28 depends upon a number of factors, including, but not limited to, the chemical composition of the ferrite, the microchip's 12 ability to tolerate heat, the speed at which the encapsulant 26 must be cured and whether the entire electronic unit (best seen in FIG. 1)) is coated with encapsulant 26. The encapsulant 26 may contain reactants to enable curing when the encapsulant 26 is catalytic.

Figure 7:
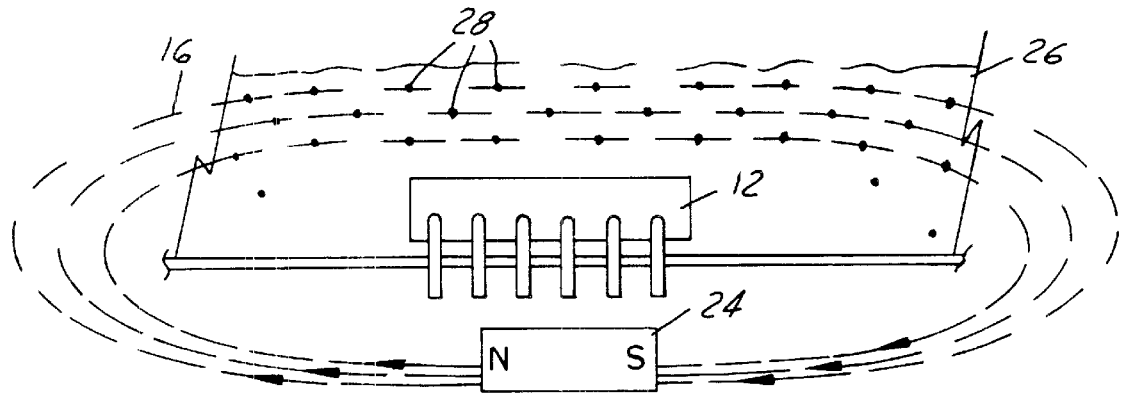
FIG. 7 illustrates the overall effect the ferrite particles have on absorbing a passive magnetic field once the ferrite particles have migrated and fixed in place by curing in accordance with one embodiment of the present invention.

Referring to FIG. 7, the overall effect the ferrite particles 28 have on absorbing the passive magnetic field interference 16 according to one embodiment of the present invention is illustrated. once the encapsulant 26 is cured, the ferrite particles 28 are fixed in their location along the field lines created by the external magnet 24. In this fixed location, the ferrite particles 28 will absorb the energy generated by the magnetic field interference 16, thus weakening overall field strength. Because of the reduction in field strength, the microchip's 12 performance improves.

Figure 8:
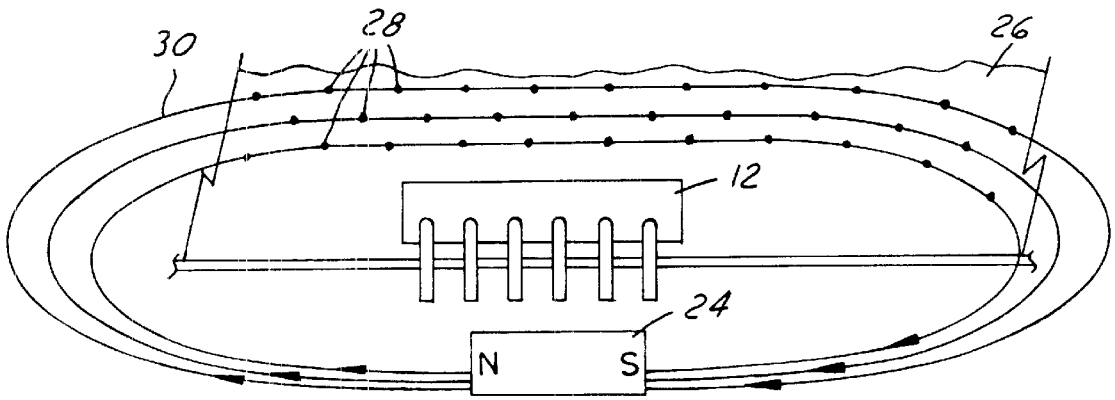
FIG. 8 depicts ferrite particles absorbing the initial magnetic field in the case where the encapsulant is not cured and the magnetic field is dynamic in nature in accordance with one embodiment of the present invention.

Referring to FIG. 8, ferrite particles 28 absorbing initial dynamic magnetic field interference 16 when the encapsulant 26 is uncured according to one embodiment of the present invention are depicted. Here, as in FIG. 6, the ferrite particles 28 are concentrated along the field lines generated by the external magnet 24. Yet unlike the previous example, the magnetic field interference 30 in this example is dynamic; thus, in order to allow the ferrite particles to freely migrate as the direction or strength of the magnetic field interference 30 changes, the encapsulant 26 is not cured.

Figure 9:
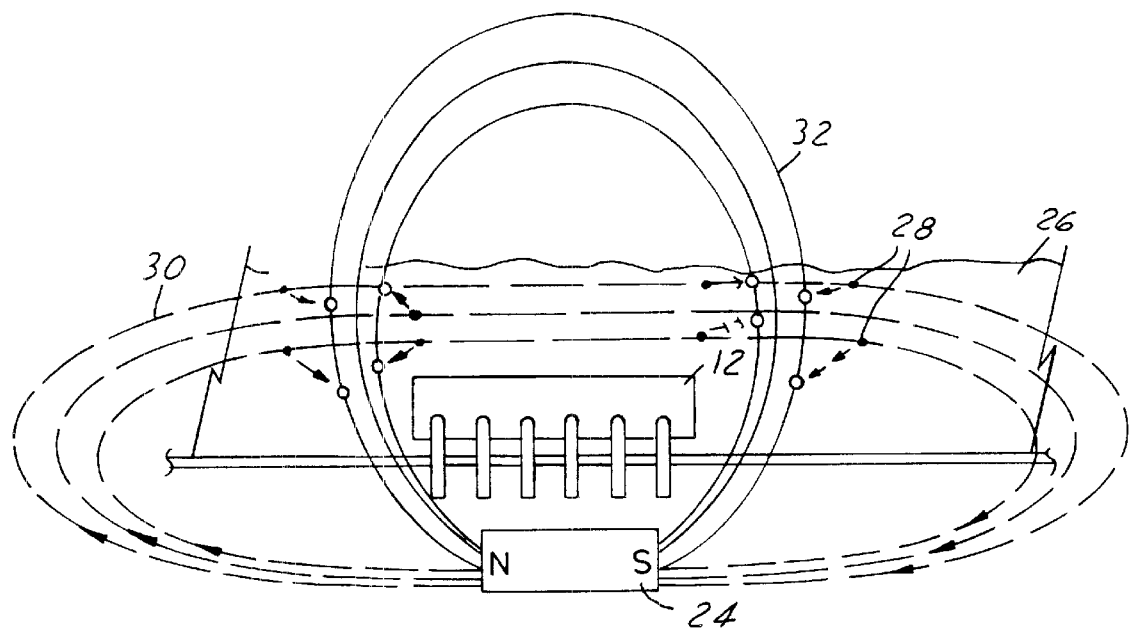
FIG. 9 illustrates ferrite particle migration in uncured encapsulant as the characteristics of the dynamic magnetic field change in accordance with one embodiment of the present invention.

Referring to FIG. 9, ferrite particle 28 migration when the magnetic field interference 16 characteristics change according to one embodiment of the present invention is illustrated. Because the encapsulant 26 is uncured, the ferrite particles are free to migrate to any location where magnetic interference exists. Here, the direction of the magnetic field interference 30 is changing. Because the natural tendency of ferrite particles 28 is to align with the strongest magnetic field present, the ferrite particles 28 will migrate from their locations along the "old," fading magnetic field interference 30 to new locations along the field lines of the "new" magnetic field interference 32.

Figure 10:
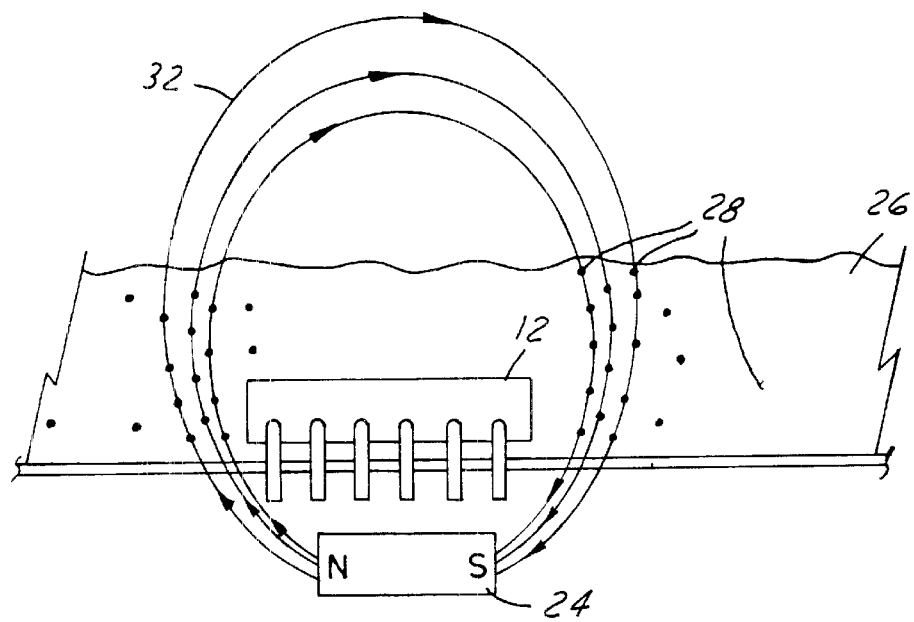
FIG. 10 shows the new location of the ferrite particles in uncured encapsulant in response to the changed characteristics of the magnetic field in accordance with one embodiment of the present invention.

Referring to FIG. 10, the new location of the ferrite particles 28 in response to the changed characteristics of the dynamic magnetic field interference 32 is shown. The ferrite particles 28 are now in alignment with the "new" magnetic field interference 32. If the strength or direction of the "new" magnetic field interference 32 changes again in the future, the ferrite particles 28, because the encapsulant remains uncured, are free to migrate to yet another new location of magnetic field interference (not shown).

From the foregoing, a new and improved method to absorb magnetic field interference is brought to the art. The preferred embodiment's preceding description merely illustrates one of the many specific applications of the principles utilized in the present invention. Clearly, numerous and other arrangements can be evident to those skilled in the art without departing from the scope of the invention as defined by the following claims.

What is claimed is:

1. A device to absorb magnetic fields that interfere with electrical components comprising:

an electronic unit containing at least one first electrical component requiring a reduction of a magnetic field; and an encapsulant surrounding said first electrical component, said encapsulant partially comprised of ferrite particles, wherein said ferrite particles, when exposed to said magnetic field interference, migrate along magnetic field lines and absorb said magnetic field.

2. The device as recited in claim 1 wherein said encapsulant comprises a base material comprising a non-conductive liquid polymer with low hygroscopic tendencies and ferrite particles where size and chemical composition of said ferrite particles are adjusted in accordance with magnetic field frequency.

3. The device as recited in claim 2 wherein said encapsulant further comprises reactants that enable curing of said encapsulant when said encapsulant is catalytic.

4. The device as recited in claim 1 wherein said at least one first electrical component, on said electronic unit, produces said magnetic field.

5. The device as recited in claim 1 wherein at least one second component external to said electronic unit produces said magnetic field.

6. A device to absorb magnetic fields that interfere with electrical components comprising:

an electronic unit containing at least one first electrical component producing a dynamic magnetic field and requiring a reduction of said dynamic magnetic field; and an encapsulant, partially comprised of ferrite particles, wherein said ferrite particles, when exposed to said magnetic field interference, migrate along magnetic field lines and absorb said magnetic field.

7. A device to absorb magnetic fields that interfere with electrical components comprising:

an electronic unit containing at least one first electrical component requiring a reduction of a magnetic field;

at least one second component external to said electronic unit producing said magnetic field, wherein said magnetic field is a dynamic magnetic field; and an encapsulant, partially comprised of ferrite particles, wherein said ferrite particles, when exposed to said magnetic field interference, migrate along magnetic field lines and absorb said magnetic field.

8. A system for absorbing magnetic field interference on an electronic unit comprising:

an electronic unit containing at least one first electrical component requiring a reduction of a magnetic field;

an encapsulant, partially comprised of ferrite particles, wherein ferrite particle size and chemical composition are adjusted in accordance with said magnetic field's frequency and wherein said ferrite particles, when exposed to said magnetic field interference, migrate along the magnetic field lines and absorb said magnetic field and wherein said encapsulant is partially comprised of a base material comprising a non-conductive liquid polymer with low hygroscopic tendencies; and a magnetic field wherein said magnetic field adversely affects component performance.

9. The system as recited in claim 8 further comprising at least one containment apparatus used to keep said encapsulant on said at least one first electrical component.

10. The system as recited in claim 8 further comprising at least one exclusion apparatus used to prevent said encapsulant from covering components on said electronic unit.

11. The system as recited in claim 8 further comprising a power supply providing voltage and current to activate said at least one first electrical component.

12. The system as recited in claim 8 further comprising a fixture wherein said electronic unit is placed and wherein said fixture contains at least one magnet to generate an external magnetic field.

\* \* \* \* \*